(12) United States Patent
Anker

(10) Patent No.: US 6,997,226 B2
(45) Date of Patent: Feb. 14, 2006

(54) METHOD OF TRANSFERRING A SUBSTANTIALLY DISC-SHAPED WORKPIECE, AND DEVICE FOR CARRYING OUT THIS METHOD

(75) Inventor: Joachim Anker, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 101 days.

(21) Appl. No.: 10/480,732

(22) PCT Filed: Jun. 13, 2002

(86) PCT No.: PCT/IB02/02258

§ 371 (c)(1),
(2), (4) Date: Dec. 12, 2003

(87) PCT Pub. No.: WO03/001587

PCT Pub. Date: Jan. 3, 2003

(65) Prior Publication Data

US 2004/0168764 A1    Sep. 2, 2004

(30) Foreign Application Priority Data

Jun. 15, 2001    (DE) ................................ 101 28 923

(51) Int. Cl.
*B32B 35/00*    (2006.01)

(52) U.S. Cl. ...................................... 156/540; 156/584

(58) Field of Classification Search ................ 117/915; 414/939, 941, 937, 935; 438/118, 106, 107, 438/477, 464, 455–458; 156/235, 497, 382, 156/381, 286, 285, 541, 540, 598, 584, 344, 156/249, 247, 241, 234, 230, 152; 269/21
See application file for complete search history.

(56) References Cited

U.S. PATENT DOCUMENTS 5,447,596 A * 9/1995 Hayase ...................... 156/584
6,470,946 B1 * 10/2002 De ............................. 156/584

* cited by examiner

*Primary Examiner*—Chris Fiorilla
*Assistant Examiner*—Sing P. Chan
(74) *Attorney, Agent, or Firm*—Peter Zawilski

(57) ABSTRACT

Consistent with an embodiment of the present invention, there is a device for transferring a substantially disc-shaped workpiece from a workpiece carier. The workpiece is fastened along a first one of its main surfaces with a double-sided adhesive foil onto a carrier foil. The workpiece is fastened onto the carrier foil along a first one of its main surfaces with of a double-sided adhesive foil onto a carrier foil on whose surface the workpiece is to be provided and fastened along the first main surface in an at least substantially planar manner. The first double-sided adhesive foil is adhesively connected by a first adhesive layer provided on its first surface to a first surface of the workpiece carrier and by a second adhesive layer provided on its second surface to the workpiece along the first main surface thereof.

7 Claims, 5 Drawing Sheets

Figure 1:
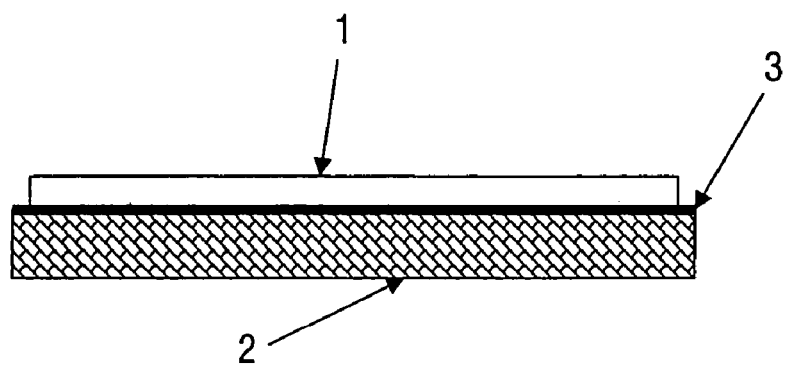

METHOD OF TRANSFERRING A SUBSTANTIALLY DISC-SHAPED WORKPIECE, AND DEVICE FOR CARRYING OUT THIS METHOD

The invention relates to a method of transferring a substantially disc-shaped workpiece. The invention further relates to a device for carrying out this method.

A temporary gluing on so-termed workpiece carriers, in particular carrier discs or carrier plates, is a suitable procedure in the case of one-sided or two-sided surface treatments of substantially planar, in particular very thin and brittle workpieces while this treatment is being carried out so as to avoid a deformation of the workpieces or indeed fracture thereof. A very thin workpiece in the present context should be understood to be a workpiece whose thickness is small in relation to its length, width, or diameter.

The German patent document 198 50 873 laid open to public inspection discloses a method of processing a substantially disc-shaped semiconductor technology product which comprises a plurality of electronic circuit bodies along at least a first main surface as well as a second main surface situated opposite the first main surface. In this method of carrying out treatment processes on one of the main surfaces of the product, a layer-type adhesive material is planarly provided on the opposite main surface of the product, onto which material a dimensionally at least substantially stable carrier element is provided so as to form a planar connection to said opposite main surface of the product.

The invention has for its object to provide a method by which a simple and inexpensive removal of a workpiece of the kind mentioned above from a workpiece carrier is made possible. The invention further has the object of providing a device for carrying out such a method.

According to the invention, this object is achieved by means of a method of transferring a substantially disc-shaped workpiece from a workpiece carrier, on which the workpiece is fastened along a first one of its main surfaces by means of a double-sided adhesive foil in an at least substantially planar manner, onto a carrier foil on whose surface the workpiece is to be provided and fastened along said first main surface in an at least substantially planar manner, which first double-sided adhesive foil is adhesively connected by a first adhesive layer provided on its first surface to a first surface of the workpiece carrier and by a second adhesive layer provided on its second surface to the workpiece along the first main surface thereof. The method according to the invention for this purpose comprises the following process steps:

weakening the second adhesive layer by an at least partial decomposition of the adhesive substance forming said second adhesive layer to a reduced adhesive force which is substantially smaller than the adhesive force of the first adhesive layer, fastening the workpiece carrier to a first retaining device, fastening the workpiece along its second main surface opposite to the first main surface to a surface of a second retaining device by means of a second double-sided adhesive foil in an at least substantially planar manner, such that the second double-sided adhesive foil is adhesively connected by a third adhesive layer provided on its first surface to the surface of the second retaining device and by a fourth adhesive layer provided on its second surface to the workpiece along the second main surface thereof, and the adhesive forces of the third and the fourth adhesive layer are substantially greater than the adhesive force of the weakened second adhesive layer, separating the workpiece from the first double-sided adhesive foil along the weakened second adhesive layer through the application of a pulling force between the first and the second retaining device, which force is at least partly perpendicular to the main surfaces of the workpiece positioning the workpiece adhesively connected to the second retaining device and the carrier foil with respect to one another such that the first main surface of the workpiece faces the surface of the carrier foil, weakening the fourth adhesive layer through an at least partial decomposition of the adhesive substance by which it is formed to a reduced adhesive force which is substantially smaller than the adhesive force of the third adhesive layer, placing the workpiece with its first main surface on the surface of the carrier foil in an at least substantially planar manner, and separating the workpiece from the second double-sided adhesive foil along the weakened fourth adhesive layer through the application of a force, generated by gas pressure, between the second double-sided adhesive foil adhering to the second retaining device and the workpiece.

The method according to the invention renders it possible in an inexpensive and simple manner to transfer also mechanically vulnerable workpieces safely from a workpiece carrier onto a carrier foil.

In particular, at least substantially rigidly constructed workpiece carriers can be used for this. The fastening of the workpiece carrier to the first retaining device may be effected, as desired, by gluing or by magnetic force.

The adhesive layers which are to be weakened for the transfer may preferably be prepared with an adhesive substance which is sensitive to heat or to ultraviolet radiation. Weakening of the adhesive layers will then take place through the influence of heat or ultraviolet radiation.

Further embodiments and particulars of the method according to the invention are defined in the dependent claims following the main claim 1.

For carrying out the method according to the invention, furthermore, a device is proposed for transferring a substantially disc-shaped workpiece from a workpiece carrier, on which the workpiece is fastened along a first of its main surfaces by means of a first double-sided adhesive foil in an at least substantially planar manner, onto a carrier foil on whose surface the workpiece is to be provided and fastened along said first main surface in an at least substantially planar manner. The first double-sided adhesive foil is adhesively connected by a first adhesive layer provided on its first surface to a first surface of the workpiece carrier and by a second adhesive layer provided on its second surface to the workpiece along the first main surface thereof. The device according to the invention further comprises a first retaining device for fastening the workpiece carrier to said first retaining device, a second retaining device with a surface on which the workpiece is to be fastened along its second main surface opposite to the first main surface by means of a second double-sided adhesive foil in an at least substantially planar manner, such that the second double-sided adhesive foil is adhesively connected by a third adhesive layer provided on its first surface to the surface of the second retaining device and by a fourth adhesive layer provided on its second surface to the workpiece along the second main surface thereof, and the adhesive forces of the third and the fourth adhesive layer are substantially greater than the adhesive force of the second adhesive layer in its weakened state.

The device according to the invention further comprises a pulling device for separating the workpiece from the first double-sided adhesive foil along the weakened second adhesive layer through the application of a pulling force which is at least partly perpendicular to the main surfaces of the workpiece between the first and the second retaining device, a device for acting on the second and the fourth adhesive layer for weakening said adhesive layers through an at least partial decomposition of the adhesive substance by which they are formed to a reduced adhesive force, as well as a gas pressure device for separating the workpiece from the second double-sided adhesive foil along the weakened fourth adhesive layer through the application of a force, generated by gas pressure, between the second double-sided adhesive foil adhering to the second retaining device and the workpiece.

The device according to the invention is of a simple construction and renders possible a reliable, inexpensive, and thus rational manufacture.

Preferably, the device according to the invention is constructed with a magnet device which can be energized or de-energized, as desired, for fastening the workpiece carrier to the first retaining device, the workpiece carrier being constructed from a ferromagnetic material. This renders possible a simple, fast, and reliable fastening of the workpiece carrier to the first retaining device. If so desired, the workpiece carrier is fastened to the first retaining device by means of gluing.

To enhance the effectiveness of the gas pressure device, a sealing device may be provided for forming a substantially gastight seal between the second retaining device and the carrier foil.

Further particulars and embodiments of the device according to the invention can be found in the dependent claims subsequent to the main patent claim 8.

Figure 2:
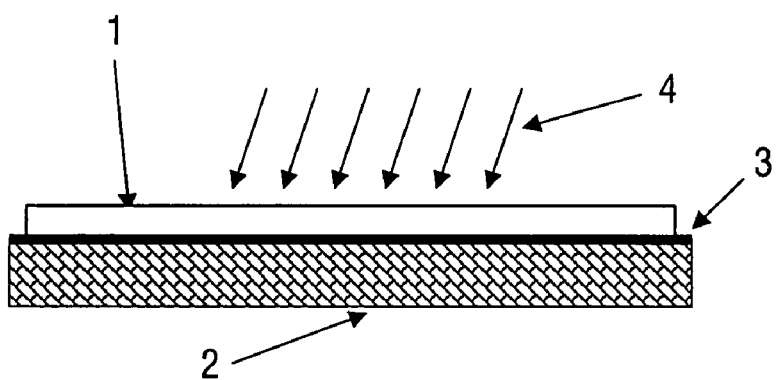
Figure 3:
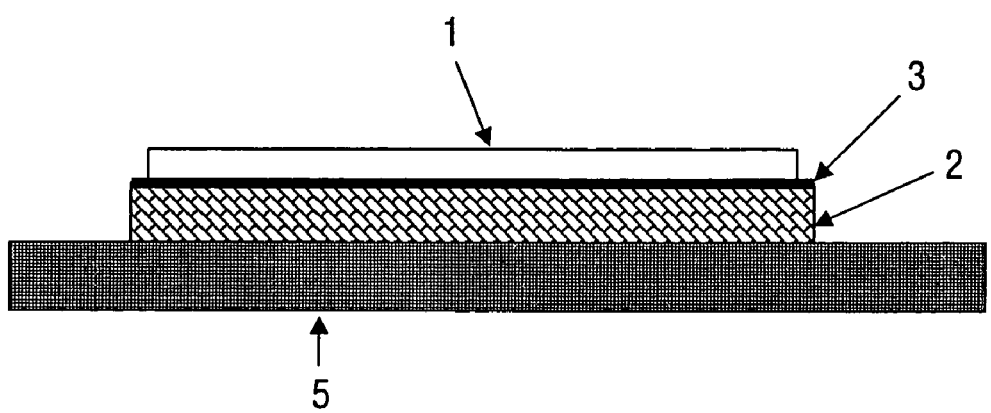
Figure 4:
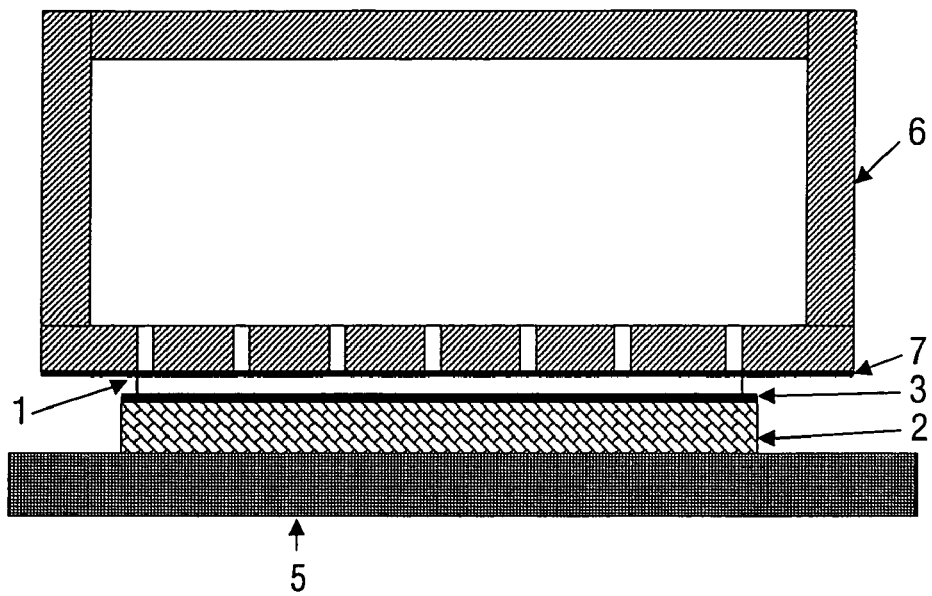
Figure 5:
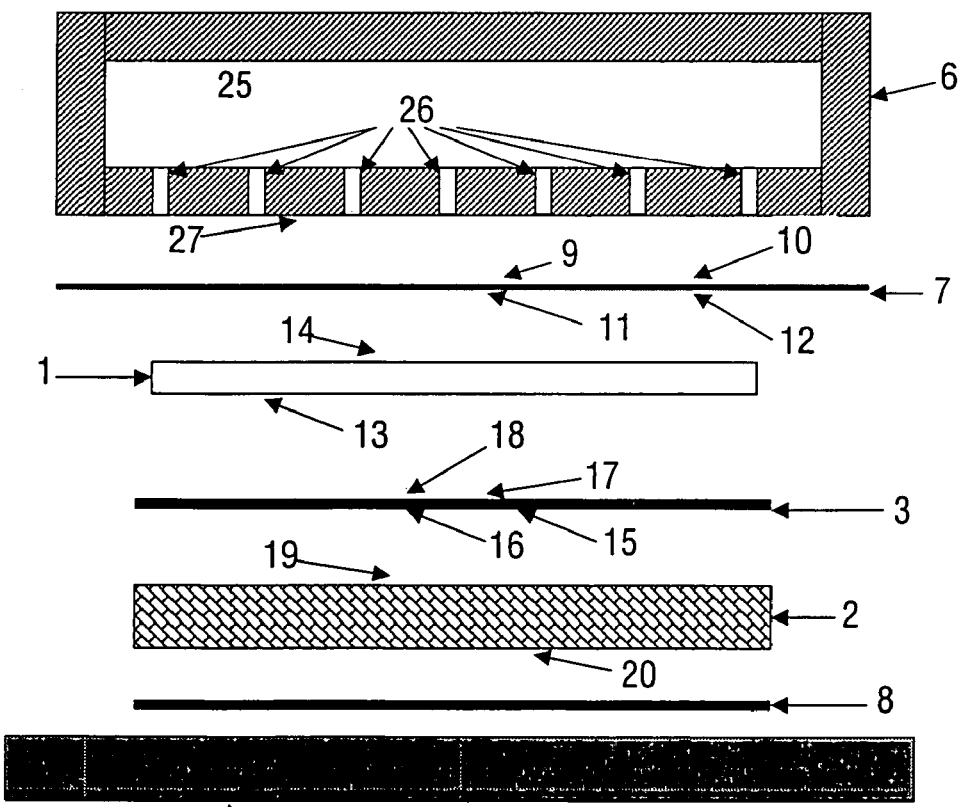
Figure 6:
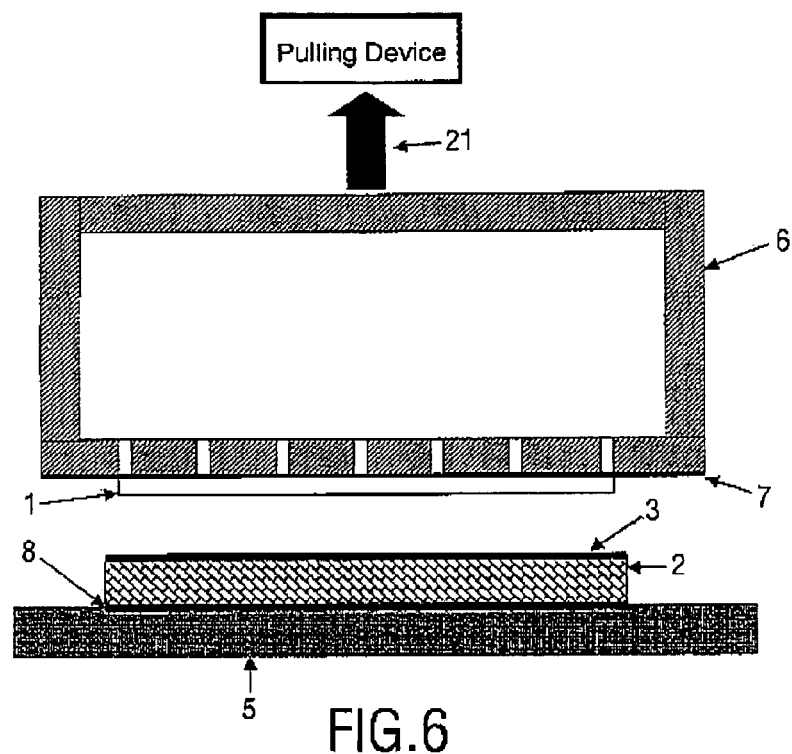
Figure 7:
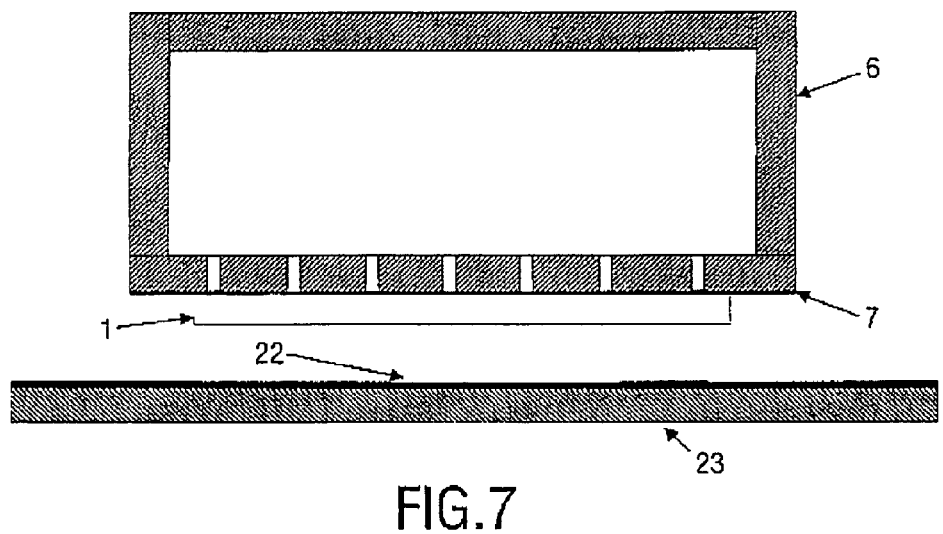
Figure 8:
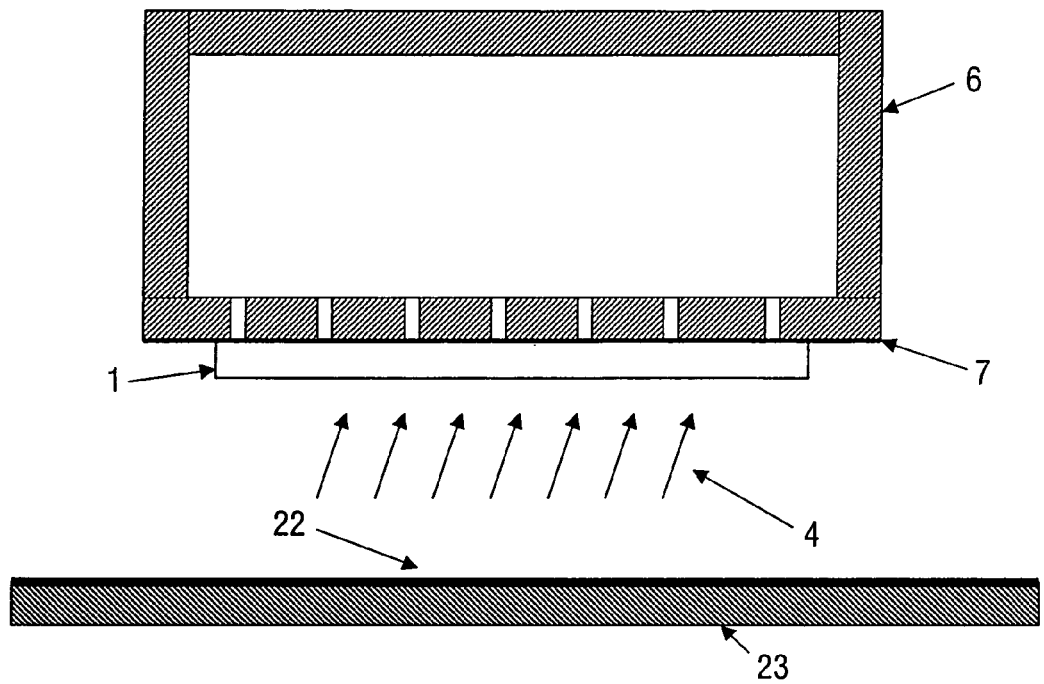
Figure 9:
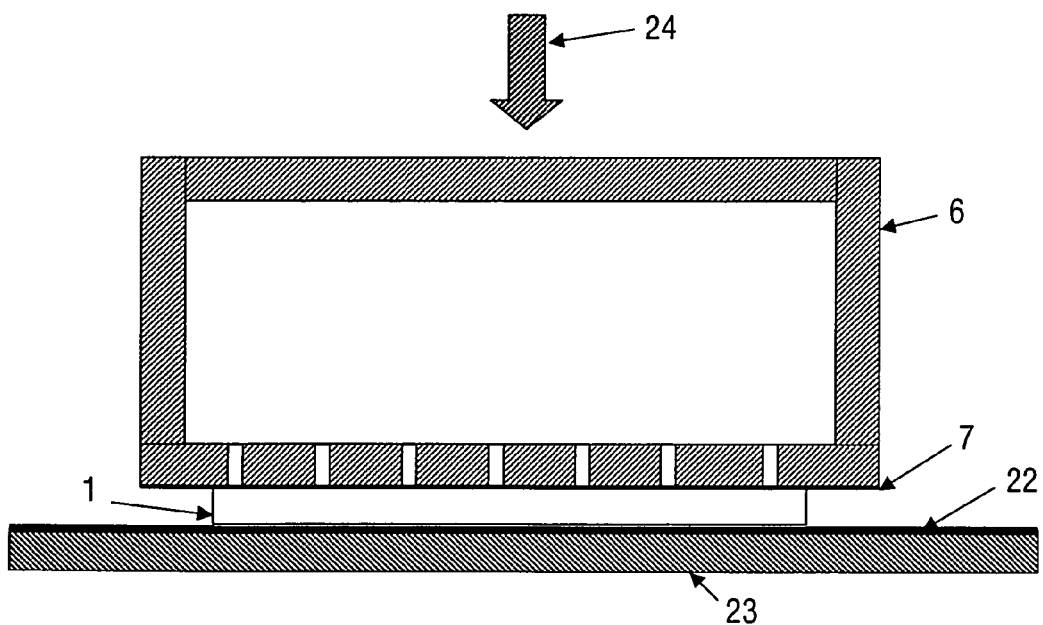
Figure 10:
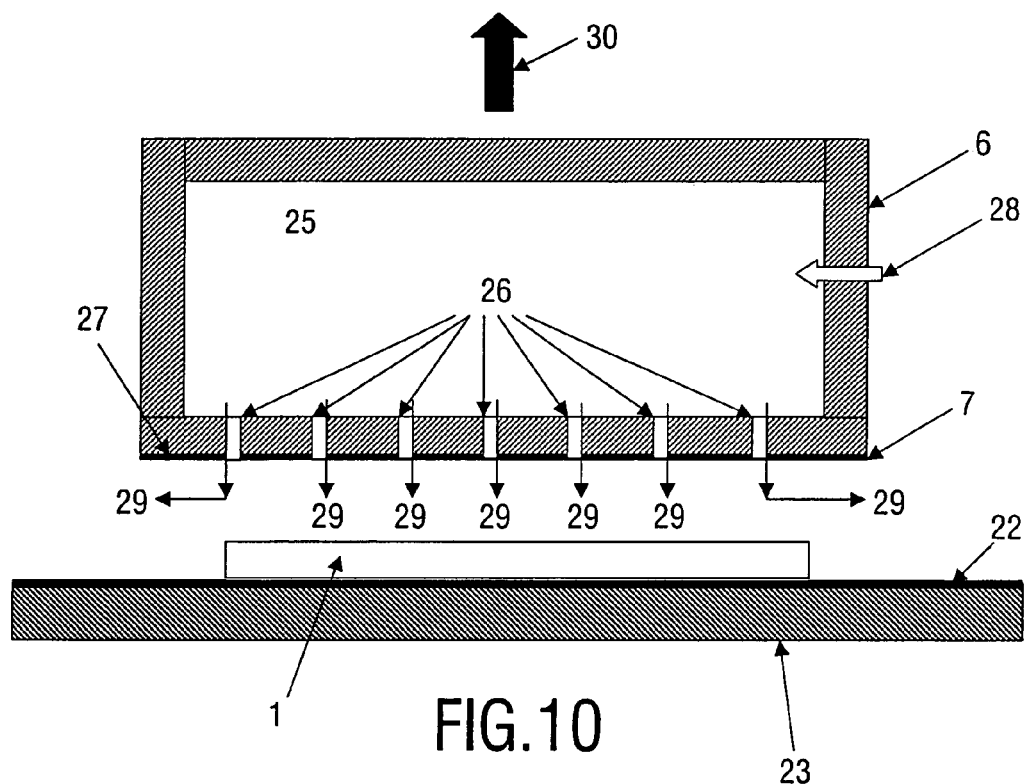
Figure 11:
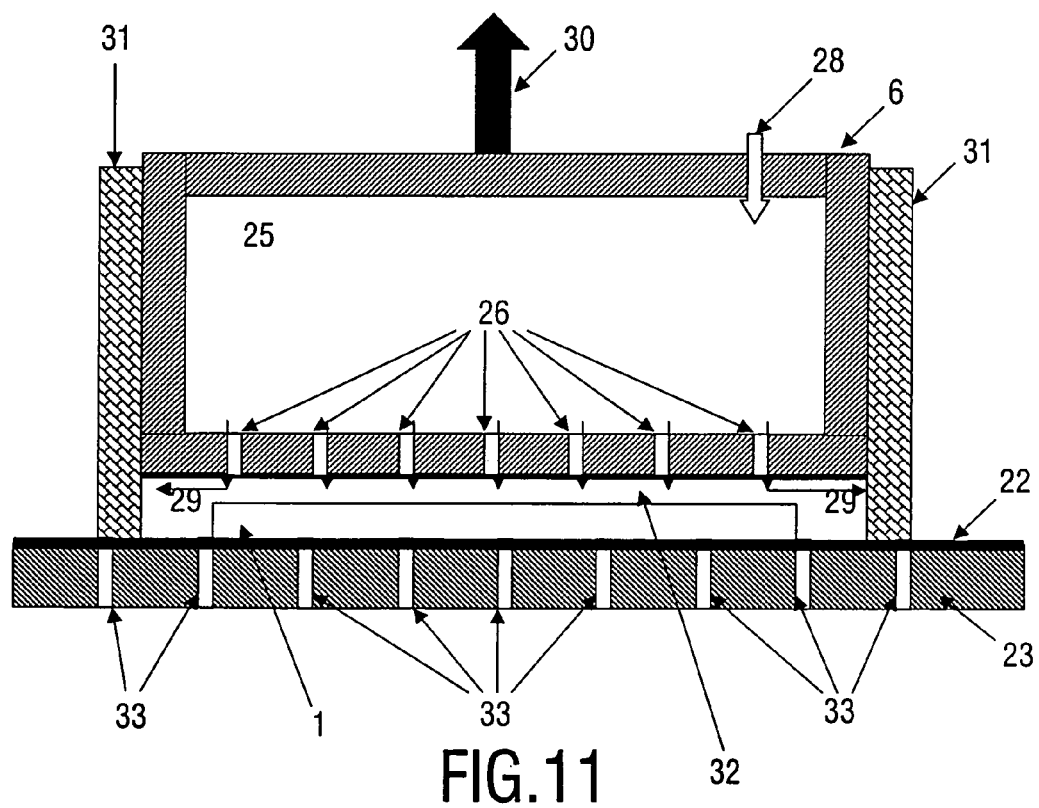

An embodiment of the invention is shown in the drawing and will be described in more detail below. In the drawing:

FIG. 1 shows an example of a workpiece fastened to a workpiece carrier by means of a first double-sided adhesive foil in a diagrammatic representation, FIG. 2 diagrammatically shows the action of heat or ultraviolet radiation for weakening the second adhesive layer between the first double-sided adhesive foil and the workpiece, FIG. 3 shows the workpiece carrier with the workpiece of FIGS. 1 and 2 after fastening to a first retaining device, FIG. 4 shows the arrangement of FIG. 3 after the workpiece has been additionally fastened to a second retaining device, FIG. 5 is an exploded view of the arrangement of FIG. 4, FIG. 6 shows the arrangement of FIG. 4 after separation of the workpiece from the workpiece carrier, FIG. 7 shows the second retaining device with the workpiece positioned above a carrier foil, FIG. 8 shows the weakening of the adhesive layer by means of which the workpiece is fastened to the second retaining device, FIG. 9 shows the placing of the workpiece on the carrier foil, FIG. 10 shows the separation of the workpiece from the second retaining device, and FIG. 11 shows a modified embodiment of the device shown in FIGS. 3 to 10 with a sealing device between the second retaining device and the carrier foil.

In the diagrammatic drawing of FIG. 1, a workpiece 1, in particular a thin semiconductor wafer, is fastened by its first main surface, which forms the lower side in the position of the workpiece 1 shown here, to a workpiece carrier 2 by means of a double-sided adhesive foil 3 in a planar manner. The first double-sided adhesive foil 3 is formed in a known manner by a foil-type synthetic resin body whose two surfaces are coated with adhesive layers. A first of these surfaces faces the workpiece carrier 2 with a first adhesive layer, and a second of the surfaces faces the workpiece 1 with a second adhesive layer. This arrangement is shown in FIG. 5.

FIG. 2 diagrammatically shows the configuration of FIG. 1 with heat or ultraviolet radiation acting thereon, indicated by the reference numeral 4. This action decomposes the second adhesive layer of the first double-sided adhesive foil 3 at least partly, thus weakening it, so that its adhesive force is reduced. For this purpose, the second adhesive layer, unlike the first adhesive layer, of the first double-sided adhesive foil 3 is made from a heat-sensitive or UV-sensitive material.

FIG. 3 diagrammatically shows the next process step in the embodiment. The workpiece carrier 2 and the workpiece 1 fastened thereon by means of the first double-sided adhesive foil 3 are fastened on a first retaining device 5 after the second adhesive layer has been weakened. This fastening may also be effected through adhesion, or alternatively by means of a magnet device which is incorporated in the first retaining device and which exerts a magnetic force on the workpiece carrier 2. The workpiece carrier 2 will for this purpose be made from a ferromagnetic material. The adhesive force of the first adhesive layer between the first double-sided adhesive foil 3 and the workpiece carrier 2 as well as the adhesive force between the workpiece carrier 2 and the first retaining device 5 are substantially greater here than the adhesive force of the weakened second adhesive layer of the first double-sided adhesive foil 3 by means of which the latter still holds on to the workpiece 1 in the process step shown here.

As is apparent from FIG. 3, the workpiece carrier 2 is preferably laid with its entire surface on the first retaining device 5.

FIG. 4 diagrammatically shows the arrangement of the preceding Figures after fastening of a second retaining device 6 by means of a second double-sided adhesive foil 7 over a second main surface of the workpiece 1 in a planar manner. This second main surface of the workpiece 1 is the upper side thereof in the representation of FIG. 4.

Details of the arrangement shown in FIG. 4 are shown in the exploded view of FIG. 5. This shows diagrammatically from top to bottom in that order: the second retaining device 6, the second double-sided adhesive foil 7, the workpiece 1, the first double-sided adhesive foil 3, the workpiece carrier 2, an adhesive 8 for fastening the workpiece carrier 2 to the first retaining device 5, and this first retaining device 5 itself. The second double-sided adhesive foil 7 here carries a third adhesive layer on its first surface 9 and a fourth adhesive layer on its second surface 11. The first main surface of the workpiece 1 is referenced 13. The second main surface of the workpiece 1 is referenced 14. The first double-sided adhesive foil 3 has the first adhesive layer 16 on its first surface 15 and the second adhesive layer 18 on its second surface 17. The first surface of the workpiece carrier 2, on which the workpiece is fastened by means of the first double-sided adhesive foil 3, is referenced 19, while a second surface 20 of the workpiece carrier 2 opposite to said surface 19 serves to fasten said carrier to the first retaining device 5.

The next process step in the embodiment shown is depicted diagrammatically in FIG. 6. Herein, the arrangement of FIG. 4 or 5 is introduced into a pulling device (not shown), and a pulling force is exerted thereby on the second retaining device 6, indicated with an arrow referenced 21. Since the adhesive forces of all adhesive elements or layers in the embodiment shown are substantially greater than the adhesive force of the second adhesive layer 18, the application of the pulling force 21 will separate the arrangement of FIG. 4 along said second adhesive layer such that the workpiece 1 detaches itself by its first main surface 13 from the second adhesive layer 18. This situation is shown in FIG. 6.

In the next process step, the first retaining device 5 is removed complete with the workpiece carrier 2 still fastened thereon, and the second retaining device 6 is positioned with the workpiece above a carrier foil 22. The carrier foil 22 is supported by a planar base surface 23 for stabilization in the embodiment shown. The situation thus achieved is shown in FIG. 7.

FIG. 8 shows the subsequent process step in which the second double-sided adhesive foil 7 is exposed to heat or ultraviolet radiation, again referenced 4 here. The fourth adhesive layer 12 on the second surface 11 of the second double-sided adhesive foil 7, by means of which the workpiece 1 adheres to this second double-sided adhesive foil 7, is prepared with an adhesive substance which is sensitive to heat or ultraviolet radiation and which can be decomposed through the action thereof. As a result, the fourth adhesive layer 12 has its adhesive force reduced to well below the adhesive force obtaining between the second double-sided adhesive foil 7 and the second retaining device 6 in the process step shown in FIG. 8. The weakening of the fourth adhesive layer 12 takes place before the workpiece 1 is placed on the carrier foil 22 so as to avoid damage to the carrier foil 22.

In the next process step shown in FIG. 9, the workpiece 1 is provided on the carrier foil 22, for which purpose the second retaining device 6 complete with the workpiece 1 is lowered onto the carrier foil 22 in a movement indicated with the arrow 24. This process step is subject to the condition that any temperature rise of the workpiece 1 caused by the preceding process step has first been eliminated.

FIG. 10 diagrammatically shows the next process step of separating the workpiece 1 from the second double-sided adhesive foil 7 along the weakened fourth adhesive layer 12, again with reference to the arrangement shown in the preceding Figures. The second retaining device 6 for this purpose comprises an inner space 25 to which a gas under pressure, preferably compressed air, can be applied through a pressure inlet valve 28. Bores 26 are provided in the portion of the second retaining device 6 forming the surface 27, on which the workpiece 1 was fastened by means of the second double-sided adhesive foil 7, through which bores the compressed gas flowing through the inlet 28 can flow out again. Matching holes are provided in the second double-sided adhesive foil 7, so that the bores 26 are not covered by the second double-sided adhesive foil 7. This renders it possible for the gas pressure in the inner space 25 of the second retaining device 6 to act directly on the workpiece 1, and the second double-sided adhesive foil 7 does not detach itself from the surface 27 of the second retaining device 6. It is ensured thereby that the workpiece 1 is separated from the second double-sided adhesive foil 7 and is deposited on the carrier foil 22.

This depositing step is preferably supported in that a movement between the second retaining device 6 and the second double-sided adhesive foil 7 connected thereto on the one hand and the carrier foil 22 with the work piece 1 adhered thereto on the other hand is carried out during the separation of the workpiece 1 from the second double-sided adhesive foil 7 at least substantially simultaneously with the application of the force generated by the gas pressure. This movement is effected so as to be at least in part perpendicular to the main surfaces of the workpiece 1 and is indicated in FIG. 10 by the arrows referenced 30. This movement 30 removes the second retaining device 6 from the carrier foil 22 and the workpiece 1. The simultaneous issuing of gas under pressure through the bores 26 is diagrammatically indicated with the arrows 29 in FIG. 10.

After the process step described above has been completed, the workpiece 1 is present on the carrier foil 22 for further processing, which may take place at its second main surface 14, said carrier foil being preferably constructed as a sawing foil for the case in which the workpiece 1 is a semiconductor technology product.

FIG. 11 shows a modification of the device described above which comprises a sealing device 31 for forming a substantially gastight seal between the second retaining device 6 and the carrier foil 22. When a gas pressure is provided through the pressure gas inlet valve 28, the pressure on the workpiece 1 can be increased for pressing the latter onto the carrier foil 22 because an overpressure 32 will be built up in the intermediate space between the second retaining device 6 and the carrier foil 22. The device shown in FIG. 11 further comprises bores 33 in the base support 23 for the carrier foil 22 for providing a vacuum suction of the carrier foil 22 and the workpiece 1 against the base surface 23.

In a modified embodiment which is not shown, the workpiece carrier 2 may be constructed from a ferromagnetic material, and the fastening of the workpiece carrier 2 to the first retaining device 5 may be effected by a magnet device. The adhesive 8 will be absent in such an embodiment. Furthermore, such a workpiece carrier 2 formed from a ferromagnetic material may obviously also be fastened to a first retaining device 5 of the kind shown in the embodiment by means of the adhesive 8.

The invention claimed is:

1. A device for separating a substantially disc-shaped workpiece from a workpiece carrier, on which the workpiece is fastened along a first of its main surfaces by means of a first double-sided adhesive foil in an at least substantially planar manner, onto a carrier foil on whose surface the workpiece is to be provided and fastened along said first main surface in an at least substantially planar manner, said first double-sided adhesive foil being adhesively connected by a first adhesive layer provided on its first surface to a first surface of the workpiece carrier and by a second adhesive layer provided on its second surface to the workpiece along the first main surface thereof, which device further comprises:

a first retaining device for fastening the workpiece carrier to said first retaining device, a second retaining device with a surface on which the workpiece is to be fastened along its second main surface opposite to the first main surface by means of a second double-sided adhesive foil in an at least substantially planar manner, such that the second double-sided adhesive foil is adhesively connected by a third adhesive layer provided on its first surface to the surface of the second retaining device and by a fourth adhesive layer provided on its second surface to the workpiece along the second main surface thereof; and the adhesive forces of the third and the fourth adhesive layer are substantially greater than the adhesive force of the second adhesive layer in its weakened state, a pulling device for separating the workpiece from the first double-sided adhesive foil along the weakened second adhesive layer through the application of a pulling force which is at least partly perpendicular to the main surfaces of the workpiece between the first and the second retaining device, the second retaining device positioned with the workpiece above the carrier foil, a device for acting on the second and the fourth adhesive layer for weakening said adhesive layers through an at least partial decomposition of the adhesive substance by which they are formed to a reduced adhesive force, and a gas pressure device for separating the workpiece from the second double-sided adhesive foil along the weakened fourth adhesive layer through the application of a force, generated by gas pressure, between the second double-sided adhesive foil adhering to the second retaining device and the workpiece.

2. A device as recited in claim 1, wherein the workpiece carrier is of an at least substantially rigid construction.

3. A device as recited in claim 1, wherein the workpiece carrier is fastened to the first retaining device by means of an adhesive whose adhesive force is substantially greater than the adhesive force of the weakened second adhesive layer.

4. A device as recited in claim 1, wherein a construction of the workpiece carrier with a ferromagnetic material and by a magnet device which can be energized and de-energized, as desired, for fastening the workpiece carrier to the first retaining device through magnetic attraction between the workpiece carrier and the first retaining device with a magnetic force which is substantially greater than the adhesive force of the weakened second adhesive layer.

5. A device as recited in claim 1 further comprises,
a sealing device for forming a substantially gastight seal between the second retaining device and the carrier foil.

6. A device as recited in claim 1, wherein the workpiece is a semiconductor technology product, preferably a semiconductor wafer, which is constructed along at least its first main surface so as to form a plurality of electronic circuit bodies which are to be mechanically separated substantially perpendicularly to the first main surface.

7. A device recited in claim 6, wherein the carrier foil is designed as a carrier medium for the mechanical separation of the electronic circuit bodies, preferably in the form of a sawing foil.

* * * * *